United States Statutory Invention Registration [19]

[11] Reg. Number: H864

Bucholtz et al. [43] Published: Jan. 1, 1991

[54] MAGNETIC FIELD SENSOR AND METHOD OF MANUFACTURE FOR A SUBASSEMBLY THEREOF

[75] Inventors: Frank Bucholtz, Crofton, Md.; Kee P. Koo; Anthony Dandridge, both of Alexandria, Va.; Alan B. Tveten, Fort Washington, Md.

[73] Assignee: United States of America, Washington, D.C.

[21] Appl. No.: 464,497

[22] Filed: Jan. 12, 1990

[51] Int. Cl.[5] ..... G01L 1/24

[52] U.S. Cl. ..... 73/800

*Primary Examiner*—Linda J. Wallace

*Attorney, Agent, or Firm*—Thomas E. McDonnell; Elmer E. Goshorn

[57] ABSTRACT

Improved passive and laser-conditioned magnetic field sensor of compact and integrated construction for enabling the detection of a magnetic field as well as an improved method of manufacture for assembling and selectively pretensioning a subassembly in order to provide an enhanced formation of the subassembly prior to use. The sensor is generally made up of a magnetic field sensing device, first and second fiber-optic elements, first and second couplers, a laser source and a combined detector and analysis means. The first and second couplers interconnect the first and second fiber-optic elements. The magnetic field sensing device is advantageously connected to one of the fiber-optic elements and is generally made up of a magneto-strictive material (MSM) of ribbon-like shape, a nonmagnetic substrate and a sensing element of optic fiber construction. This element is of predetermined and selective multistrand design between its ends and of generally serpentine shape. The sensing device is advantageously formed such that the MSM and the sensing element are uniformly and selectively pretensioned. As the result of this pretensioning, the MSM elongates when a magnetic field is detected thereby decreasing the elongation of the sensing element. Despite this decrease, the sensing element remains tensioned because of sufficient pretensioning and the phase shift in the laser as it is conducted through the optic fiber is detectable by the combined means.

12 Claims, 2 Drawing Sheets

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

MAGNETIC FIELD SENSOR AND METHOD OF MANUFACTURE FOR A SUBASSEMBLY THEREOF

The invention concerns a magnetic field sensor and method of manufacture for a subassembly thereof and more particularly it concerns an improved passive and laser-conditioned magnetic field sensor having a pair of fiber optic elements with one of the elements provided with a novel magnetic sensing device for detecting the presence of a magnetic field and also having a combined optical and signal analysis means for detecting the difference in the pair of elements when one of the elements detects a magnetic field thereby enabling the determination of the detected magnetic field intensity. The improved method of manufacture concerns certain components of the magnetic sensing device being selectively pretensioned so as to provide enhanced sensitivity in detecting a magnetic field.

BACKGROUND OF THE INVENTION

Various designs and solutions have been provided in the past for sensing and immediately analyzing various types of conditions in different environments that otherwise are not easily detectable and measurable without the assistance of some sort of instrumentation. For example, U.S. Pat. No. 4,736,620 to N. Adolph discloses an instrument for continuously measuring knock in internal combustion engines. The instrument is generally made up of a magneto-strictive wire element anchored at one end to the engine and at the other end to a suitable securing means. A permanent magnet/output coil sensing means is provided about the element between its ends and provides a signal indicative of the changes in the element as the result of engine knock. U.S. Pat. No. 4,751,690 to H. A. Krueger discloses a light-conditioned and optic-fiber interferometric hydrophone arrangement for detecting an acoustic field. The arrangement is generally made up of a one piece rigid support shell having along its length a series of opposed and reversely oriented acoustic windows. Each window is provided with a diaphragm. An acoustically responsive bendable beam extends through all windows including the diaphragms arranged therein. A pair of optical fibers extend the length of the beam such that the fibers are disposed on opposed major face sides of the beam. The pair of fibers are also reversely disposed at each window with one fiber being on the front side of the beam at one window and on the back side thereof at the adjoining window all for the purpose of substantially eliminating lateral effects in interferometric analyzing any acoustic field detected by the fibers during arrangement use. U.S. Pat. No. 4,841,778 to M. A. Butler et al. relates to a laser-conditioned optical fiber arrangement for use in an electrolytic cell for detecting optical fiber strain variations and thus changes in electro-chemical deposition. The arrangement is generally made up of a pair of optical fibers both being threaded through an electrolytic cell with one being a working electrode and subject to electro-deposition during cell use. As the deposition varies, the strain on the electrode fiber varies and with the other fiber being a reference fiber, the difference in optical path lengths between the two fibers can be detected by interferometry techniques. However, none of the aforediscussed patents whether taken singly or in any combination remotely suggest the improved passive and laser-conditioned magnetic field sensor of the instant invention where the sensor is of integrated and compact construction and incorporates a novel magnetic field sensing and indicating device. This device is generally made up of a nonmagnetic substrate, magneto-strictive ribbon-like material (MSM) and a multistrand optic fiber element of generally serpentine shape and generally flat planar profile. The number of strands per element depends upon its application and use. During manufacture, the optic fiber element is connected to the MSM and then both the connected MSM and the element are selectively tensioned prior to being affixed as tensioned to the substrate. This enables the MSM that is not only responsive to a magnetic field being detected but also maintains sufficient tensioning of the optic-fiber element, despite elongation of the MSM and corresponding decrease in elongation of the element. This sufficient tensioning (pretensioning) of the opto-fiber element despite MSM elongation assures accurate detection of the phase shift in the laser beam transmitted therethrough as effected by the sensor sensor during its use.

SUMMARY OF THE INVENTION

An object of the invention is to provide an improved passive and laser-conditioned magnetic field sensor that is of integrated and compact construction and that incorporates a novel magnetic field sensing and indicating device that not only is uniquely assembled in being selectively pretensioned but can be readily designed for particular applications.

Another object of the invention is to provide an improved passive and laser-conditioned magnetic field sensor that by use of a laser beam and optic fibers is not susceptible to interference from external sources during its use.

Still another object of the invention is to provide an improved magnetic-field sensor that is of lightweight and compact one-piece construction thereby enabling it to be used in a wide variety of applications.

In summary, this invention concerns an improved passive and laser conditioned magnetic-field sensor of generally lightweight and compact one-piece construction. The sensor is generally made up of laser source means, reference optic fiber means, another optic fiber means for indicating the presence of a detected magnetic field by having its optical path decreased, a magnetic field sensing element, first and second couplers and combined optical detector and signal analysis means for analyzing and visually indicating the presence and magnitude of a magnetic field when detected by the sensor. The couplers serve to couple together opposed ends of both optical fibers so that the reference fiber, in also being connected to the laser source means, uniformly transmits the laser beam to both the reference fiber and the other fiber as well. The optical fibers after being connected to the other coupler are then connected to the combined means for analysis.

The other optical fiber between the couplers is provided with a novel magnetic field sensing device. This device is generally made up of a nonmagnetic substrate, a magneto-strictive ribbon-like material (MSM) of suitable length and a specially formed element. This element is made up of a length of optical fiber that is generally of flat/planar profile and approximate serpentine shape as formed so as to provide a series of laterally spaced parallel strand portions between its ends and also a series of uniformly laterally spaced and partially overlapped coiled portions at either end. In advantageously forming the sensing device, opposed and longitudinally aligned adjoining ends of both the MSM and the special formed element are bonded together such as by a suitable grade of Epoxy. The other end of the MSM is also bonded to the substrate.

The other end of the element is provided with a pull string such that once the MSM is affixed to the substrate, the MSM and the element after being connected together are uniformly and selectively tensioned by the pull string upon a user or some other means satisfactorily grasping and pulling the string. When both the MSM and the element are sufficiently and selectively pretensioned by the user grasping and pulling the string, the other or pull string end of the device is affixed to the substrate thereby maintaining the tension.

The pretensioning should be such that both the MSM and the element remain tensioned throughout normal use of the device and will remain sufficiently tensioned when the MSM senses the presence of a magnetic field, responds to it the same by increasing its initial length and thus causing a decrease in the length of the series of the parallel strand portions of the element. This changes the optical path length of the other fiber; and thus, causes a phase shift in the laser beam being transmitted by the other fiber that is detectable by the combined means for visually indicating the presence and strength of a magnetic field as detected by the sensor during its use.

It can be mathematically shown that the change in length of the parallel strands of the device is proportional to the number of parallel strands. Thus, the sensitivity of the device is generally controllable by the number of strands being used in relation to the intended applicability of the sensor as designed. Hence, the sensor can be readily tailored to meet any particular application for detecting magnetic fields.

Other objects and advantages of the invention will become more fully apparent when taken in conjunction with the specification and drawings as follows:

DETAILED DESCRIPTION OF THE INVENTION

Figure 1:
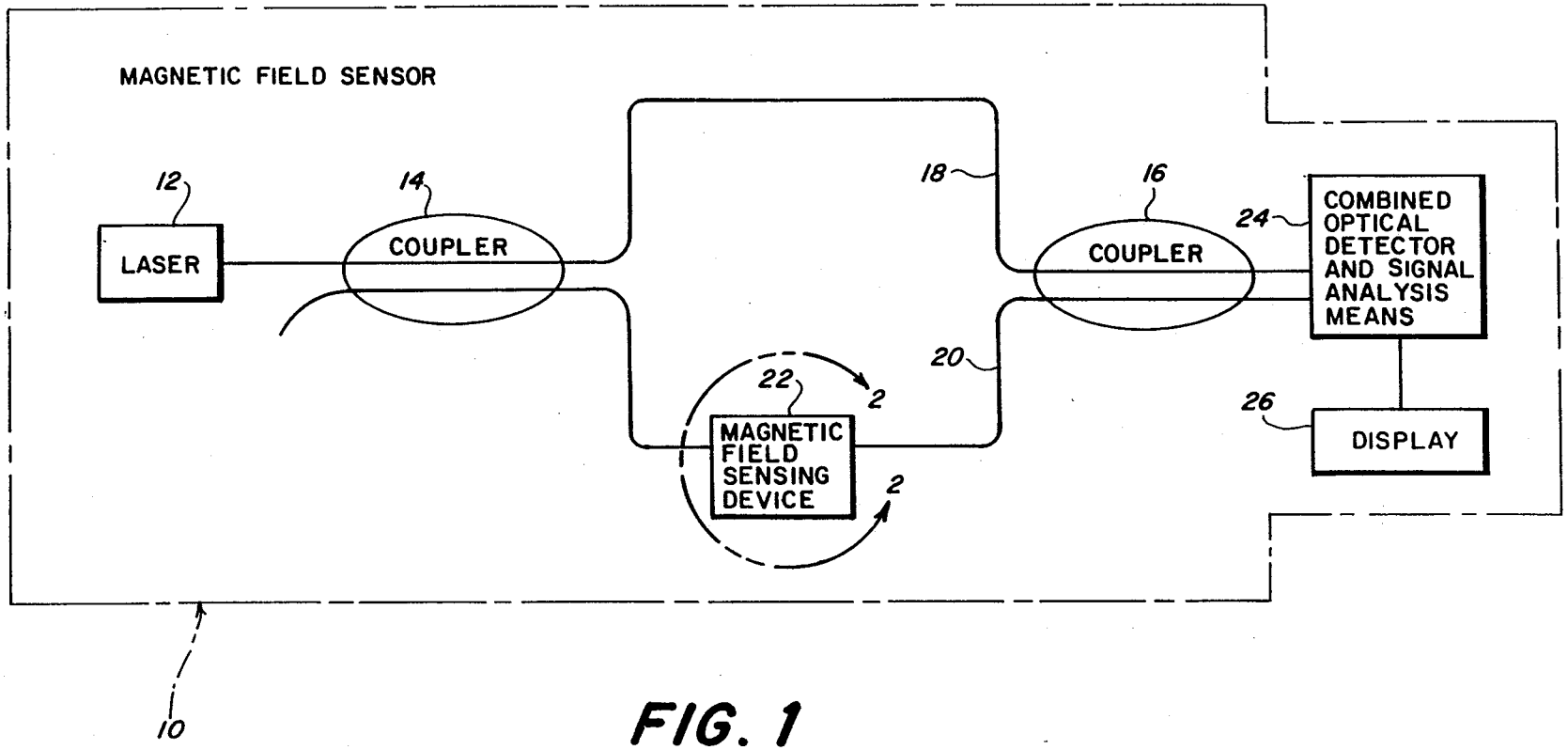
FIG. 1 is a diagrammatic view of an embodiment of an improved passive and laser-conditioned magnetic field sensor of the invention.

With further reference to FIG. 1, an improved passive and laser conditioned magnetic field sensor 10 is generally made up of laser beam source means 12, first and second couplers 14 and 16, a reference or first optical fiber 18, a second or another (working) optical fiber 20 for indicating the presence and magnitude of a detected magnetic field, a magnetic field sensing device 22 and combined optical detector and signal analysis means 24 including a visual display 26. By reason of the sensor being compact and relatively lightweight together with its passive/laser-conditioning, the improved sensor is capable of being used in a wide variety of applications for detecting one or more magnetic fields including the magnitude thereof. The sensor also exhibits a high degree of sensitivity in detecting a magnitude field as well as being substantially free of interference.

As further shown in FIG. 1, coupler 14 connects opposed ends of fibers 18 and 20 at one end of the sensor such that fiber 18 is further connected to laser source means 12. Similarly, coupler 16 at the other end of the sensor not only interconnects the other opposed fiber ends in spaced relation to each other but also enables connection of these fiber ends to combined detector and analysis means 24.

Figure 2:
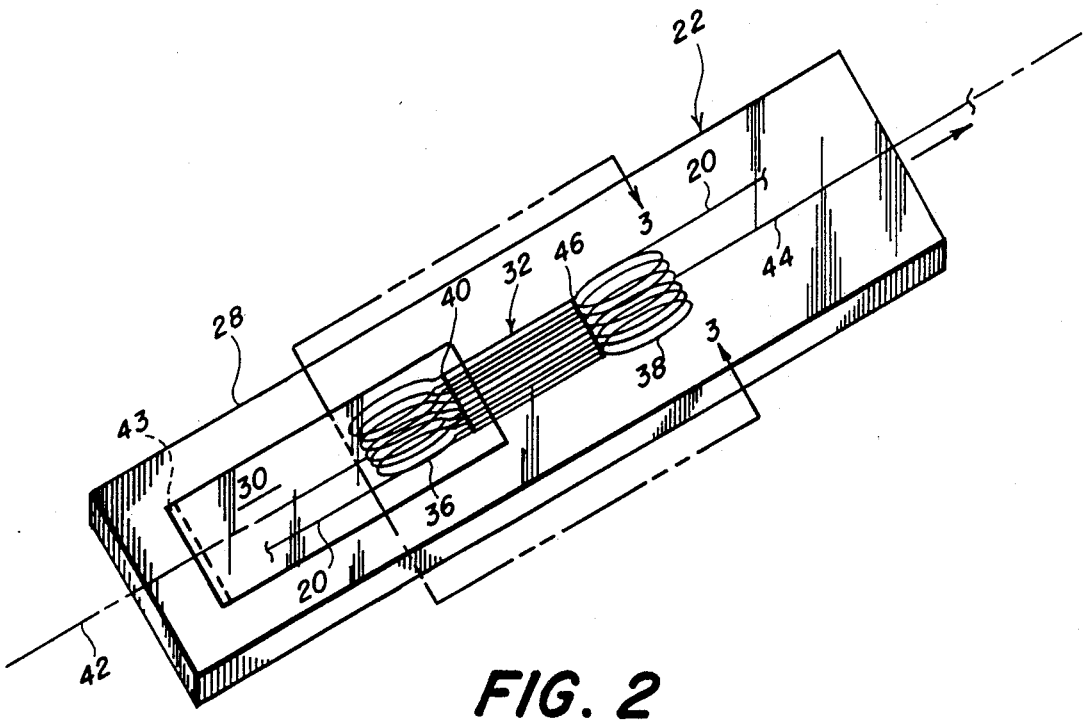
FIG. 2 is an enlarged perspective view with parts added of a magnetic field sensing device of the invention to illustrate details thereof as taken within the perimeter of encircling line 2—2 of FIG. 1 and further illustrates a technique for selectively pretensioning and affixing certain components of the sensing device to its substrate as the device is being manufactured.

With further reference to FIG. 2, magnetic field sensing device 22 is generally made up of a nonmagnetic substrate 28, a magneto-strictive ribbon-like material (MSM) 30 of a suitable length and a multistrand optical fiber sensing element 32 of generally flat/planar profile and approximately serpentine shape. The element is preferably of an overall length that is similar to the length of MSM 30 and is responsive to the longitudinal extension or elongation of MSM 30 when detecting a magnetic field as the sensor is used such that each one of the plurality of strands of element 32 uniformly decreases in length as will be more fully explained hereinafter. The magneto-strictive material can be essentially composed of one or more compositions or alloys selected from the group of metallic glass, rare earth alloys and a tertiary alloy of iron, cobalt, and nickel (Fe-Co-Ni). The magneto-strictive material instead of flat/planar profile as shown in FIG. 2 could be of cylindrical shape or of arcuate extent.

Figure 3:
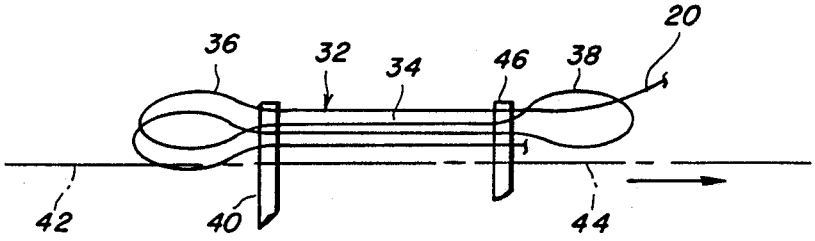
FIG. 3 is an enlarged top view with parts added and other parts broken away as taken within the bounds of circumscribing line 3—3 of FIG. 2 and illustrate further details of the sensing device.

As best shown in FIG. 3, element 32 is generally made up of a length of optical fiber that is wound in suitable fashion so as to provide a plurality of lateral parallel spaced fiber or strand portions 34 between its ends and with each fiber portion being substantially equal length. Opposed and reversed partially coiled portions 36 and 38 of optical fibers are disposed at either end of the device such that one end of a given coiled portion at either end of element 32 is connected to the adjoining end of its associated strand portion while the other end of the given coiled portion at either end of the element is connected to the adjoining end of the immediately next parallel spaced strand portion 34. Such connection of all coiled portions 36 and 38 of element 32 at either end thereof assures that the element is of endless uninterrupted and integrated construction between its ends while at the same time it is of generally flat/planar profile and approximate serpentine shape. Opposed ends of initial and last arranged strands 34 (the outer most laterally spaced strands) at either end of element 32 are integrally connected to opposed and relatively spaced intermediate portions of optical fiber 20 so as to provide a series connection therebetween. It is noted here that the radius of each coiled portion 36 or 38 of element 32 should be such that there is minimal light loss as a laser beam from source means 12 is transmitted through the length of fiber 20 including the length of optical fiber of element 32 during sensor use. Optical fibers 18 and 20 along with the optical fiber of element 32 are preferably of the same uniform diameter.

Opposed ends of element 32 and MSM 30 are longitudinally aligned and bonded together (affixed) as depicted in FIG. 2. To this end, a strip of adhesive material 40 of a length equal to the width of parallel-spaced strands 34 overlays the adjoining ends of laterally spaced strands 34 at one end of element 32. This material 40 can be impregnated with an Epoxy material in order to effect permanent bonding of element 32 to MSM 30 so that both element 32 and MSM 30 are centered along their common longitudinal axis 42 as assembled. The opposed end of MSM 30 along an underlying transverse strip portion 43 thereof is similarly bonded by an Epoxy or the like to a major exposed surface portion at one end of the substrate so that axis 42 coincides with the longitudinal axis of substrate 28.

A pull string 44 of suitable length is connected to the opposed end of element 32 at the area of juncture with another adhesive strip 46 overlying the adjoining ends of strands 34 at the opposed end of element 32. This connection of string 44 to strip 46 preferably occurs at a center point thereon that substantially coincides with axis 42. After element 32 and MSM 30 are connected together and MSM 30 is connected to substrate 28, string 44 is grasped and pulled by the user or some suitable means until MSM 30 and element 32 are sufficiently and uniformly tensioned. Then an underlying portion of strip 46 if forced against another exposed major surface portion of substrate 28 and bonded thereto so as to maintain material 30 and element 32 under uniform and selectively sufficient pretension throughout normal use of sensor 10. After the device and MSM are sufficiently pretensioned and affixed to substrate 28 then pull string 44 can be removed by severing same if desired. As will become more apparent hereinafter when MSM 30 detects the presence of a magnetic field as the sensor is being used, MSM 30 tends to lengthen or increase its length thereby relaxing the tensioning of both the MSM and element 32. As the result of this tensioning decrease, strands 34 of element 32 are uniformly decreased in length thereby reducing the optical path length of fiber 20 as a laser beam from source 12 is transmitted through fiber 20 and element 32. This decrease or change in optical fiber length is detectable by combined means 24 as a phase shift between the light transmitted by fibers 18 and 20. The degree of phase shift for any magnetic field detected should be calibrated so as to indicate the magnitude of the field detected on display 26 including it maximum value thereon. Hence, element 32 and MSM 30 should be sufficiently pretensioned as to always assure that the element and MSM remain sufficiently tensioned before, during and after detection of any magnetic fields as the sensor is being normally used so that the element and the MSM are never decreased in tension that would impair the operation of the sensor itself.

It is evident from FIG. 2 that the number of strands 34 in element 32 determines its resistance to a decrease in its elongation; and thus, its sensitivity. Hence, in some use of sensor 10, a greater or smaller number of strands 34 may be required to obtain the sensitivity desired in detecting a magnetic field by sensor 10 as it is used in a particular fashion. Moreover, the change in length of strands 34 is proportional to the number of strands which can be expressed by the following mathematical formula;

$$\Delta l_f = \frac{l_m C H^2}{1 + \eta R l_m / l_f}$$

where $\Delta 1_f$ is the change-in length of any strand 34 of element 32, where $1_f$ is the length of any strand 34 thereof, where $1_m$ is the length of MSM 30, where "n" is the number of strands 34 in element 32, where "C" is the quadratic coefficient for the magnetostrictive responsiveness of MSM 30 per unit of magnetic field, where "H" is the magnetic field strength; and where "R" is a constant and equal to the following formula:

$$R = \frac{Y_f A_f}{Y_m A_m}$$

where $Y_f$ and $Y_m$ are the Young's moduli for $1_f$ and $1_m$ respectively, and where $A_f$ and $A_m$ are the cross sectional areas for any strand 34 of element 32 and MSM 30 respectively. It is also evident that the total phase shift in the light being transmitted by fiber 20 as the result of its decrease in elongation as effected by MSM 30 when subjected to a magnetic field is proportional to the multiplied product of two terms $\eta \cdot \Delta 1_f$. The length of any strand 34 has been found to be equal to the product of three terms, namely: $\eta R 1_m$. This product for critical strand length represents an optimum strand length design as a trade off between total fiber length $(\eta \cdot 1_f)$ and sensitivity of element 32 as it is used by sensor 10.

It should now be evident that sensor 10 in not having any moving parts is highly versatile and of durable construction that enables it to have a wide variety of applications in detecting any magnetic field.

Obviously, many modifications and variations of the present invention are possible in light of the above teachings, it is therefore to be understood that, within the scope of the appended claims, the invention may be practiced otherwise than as specifically described.

What is claimed is:

1. A passive and laser-conditioned magnetic field sensor generally made up of a laser beam source, first and second couplers, first and second optical fibers and a detector, the first and second couplers being connected to opposed ends of the first and second optical fibers at opposed ends of the sensor such that the first and second fibers extend fully therebetween, the second coupler including output means separately connected to the detector for analyzing the laser beam light being transmitted by the first and second fibers and for detecting a phase shift when the sensor is exposed to a magnetic field, a magnetic field sensing device being connected to an intermediate portion of the second fiber, the improvement comprising:

the magnetic field sensing device being made up of substrate means, magnetostrictive material MSM means of ribbon-like configuration and a multistrand device MSD of serpentine shape and generally flat shape and planar profile, one end of the MSM means being affixed to one end of the substrate means, opposed and adjoining ends of the MSM means and the MSD being connected together; another and opposed end of the multistrand device including tensioning means for selectively and uniformly pretensioning the MSM means and the MSD when the one end of the MSM means is connected to the substrate means, when the opposed ends of the MSM means and the MSD are also connected together, and when the other end of the MSD is also connected to the substrate means so as to maintain tensioning of the MSM means and the MSD after the MSD and the MSM means are pretensioned by the tensioning means, the MSD being made up of a plurality of parallel laterally spaced elongated strands and a series of partially open coil portions, each coil portion being connected to opposed ends of adjacent strands at either end of the MSD so as to provide a continuous uninterrupted overall strand length of both interconnected strands and coil portions all strands of the plurality and all coil portions of the plurality of the MSD being generally arranged between initial and last strands of the plurality of strands of the MSD as well as being of general serpentine shape therebetween, and the plurality of strands being relaxed in tension and decreased in elongation when the MSM means is subject to a magnetic field so that the elongated strands as the result of decrease in their elongation cause a phase shift in the laser light being transmitted therethrough that is detectable by the detector during sensor use.

2. A sensor arrangement as set forth in claim 1 wherein the elongation of the plurality of strands when pretensioned can be expressed by the following formula:

$$\Delta l_f = l_f \frac{l_m C H^2}{1 + nRl_m/l_f}$$

where $\Delta 1_f$ is the change in length of any strand when each pretensioned strand of the MSD is decreased in elongation as the result of the MSM means being exposed to a magnetic field, where $1_f$ is the length of any strand of the plurality of strands of the MSD, where $1_m$ is the length of MSM, where "n" is the number of strands of the plurality thereof, where "C" is the quadratic coefficient for the magnetostrictive responsiveness of the MSM means, where "H" is the magnetic field strength, and where "R" is a constant and equal to the following ratio and multipliable terms:

$$\frac{Y_f A_f}{Y_m A_m}$$

with $Y_f$ and $Y_m$ each relating to separate values of the Young moduli for any strand and the MSM means respectively; and $A_f$ and $A_m$ being the cross sectional area for any strand and MSM means respectively.

3. A sensor as set forth in claim wherein the critical length of any strand in definable by the mathematical formula that is equal to:

$$nR1_m$$

where "n" is the number of strands of the plurality of strands; where R is a constant and equal to the following ratio and multipliable terms, $(Y_f\ A_f)/(Y_m\ A_m)$; where $1_m$ is the length of MSM, where $Y_f$ and $Y_m$ each relate to separate values of Young Moduli for any strand and the MSM means respectively; and where $A_f$ and $A_m$ being the cross sectional area for any strand and MSM means respectively.

4. A passive and laser conditioned magnetic field sensor, comprising:

laser means providing a laser light source, first and second fiber-optic F-O means, first and second coupler means, the first and second coupler means including means for interconnecting the first and second F-O means therebetween, the first F-O means being connected to the laser, combined detection and analysis CDA means, the second coupler means including means for separately connecting the first and second F-O means to the CDA means, the second F-O means having opposed and relatively spaced intermediate portions, the second F-O means including magnetic field sensing device MFSD means connected to the opposed intermediate portions thereof, the MFSD means being comprised of nonmagnetic substrate means, magnetostrictive material MSM means having opposed ends, and intermediate fiber-optic portion IFOP means having opposed ends, the IFOP means in being affixed at one of its opposed ends to one of the opposed ends of the MSM means and at the other of its opposed ends to the substrate means, the other of the opposed ends of the MSM means being affixed to the substrate means so that the MSM and IFOP means are arranged in elongated longitudinally aligned and selectively pretensioned relation to each other prior to use of the sensor, the IFOP means being of generally planar profile and of compact serpentine shape that is generally made up of a plurality of at least three parallel spaced and intermediately disposed fiber-optic strands IFOS means and a series of at least two partially open loop means with at least one loop means of the series being disposed at either end of the IFOP means and with the loop means being arranged in opposed and reverse relation to each other for interconnecting the plurality of IFOS means while at the same time interconnecting opposed ends of the outermost strands of the plurality of the IFOS means to the opposed intermediate portions of the second F-O means between its ends; and the MSM means being responsive to a magnetic field when detected for causing partial relaxation in the pretensioning of IFOS means so as to cause a decrease in the elongation of the IFOS means thereby inducing a phase shift in the uninterrupted transmission of laser light from the laser means via the second F-O means and the first and second coupler means; and the CDA means for analyzing the phase difference between the first and second F-O means when a magnetic field is sensed by the sensor and the MFSD means thereof.

5. A sensor as set forth in claim 4, wherein the MSM means is of ribbon-like shape and generally planar profile.

6. A sensor as set forth in claim 4 wherein the MSM means is of curvilinear shape.

7. A sensor as set forth in claim 4 wherein the MSM means is essentially composed of metallic glass.

8. A sensor as set forth in claim 4 wherein the MSM means is essentially composed of a ternary alloy of iron, nickel and cobalt.

9. A sensor as set forth in claim 4 wherein the substrate means, the MSM means and the IFOP means are all centered in relation to a common longitudinal axis extending therebetween.

10. A passive magnetic field sensing device MFSD means for use in a laser-driven fiber-optic magnetic sensor, said MFSD means comprising:

non-magnetic substrate means, magneto-strictive material MSM means having opposed ends, and intermediate fiber-optic portion IFOP means having opposed ends and providing uninterrupted transmission of laser light therethrough, the IFOP means being affixed at one of the opposed ends to the substrate means, the other of the opposed ends of the MSM means being affixed to the substrate means so that the MSM and IFOP means are arranged in elongated and selectively pretensioned relation to each other and the substrate means prior to use of the MFSD means, the IFOP means being of generally planar profile and of compact serpentine shape that is generally made up of a plurality of at least three parallel-spaced and intermediately disposed fiber-optic strands IFOS means having opposed ends and with each IFOS means of the plurality being of uniform length; and a series of at least two open coil means with at least one open coil means of the series at either end of the plurality of IFOS means being arranged in opposed and reverse relation to each other for interconnecting the plurality of IFOS means; and the MSM means of the MFSD means having the characteristics of being responsive to a magnetic field when sensed to further elongate the MSM means thereby causing a partial relaxation in the pretensioning of the MSM and the IFOP means and a decrease in the elongation of the IFOP means so as to induce a change in the optical path length of the IFOS means and thus a detectable phase shift in the transmission of laser light when passed through the MFSD means during its use.

11. A method for manufacturing magnetic field sensing device MFSD means for use in a laser-conditioned fiber-optic magnetic sensor, the method comprising the steps of:

affixing opposed and adjacent ends of longitudinally aligned magneto-strictive material MSM means and fiber-optic F-O means so as to form a unitized subassembly, then affixing the opposed and free end of the MSM means to substrate means, and temporarily affixing pull means to the opposed and free end of the F-O means so as to enable sufficient and selective pretensioning of the subassembly prior to affixing the opposed and free end of the F-O means to the substrate means so as to form an elongated and selectively pretensioned subassembly in relation to the substrate means prior to the MSM means being exposed to a detected magnetic field for causing partial relaxation in the pretensioning of the MSM and the F-O means including a partial decrease in the elongation of the F-O means thereby enabling the strength of the detected magnetic field to be determinable.

12. A method as set forth in claim 11 wherein the F-O means is of generally serpentine shape that is generally made up of a plurality of at least three parallel-spaced and intermediately disposed fiber-optic strands having opposed ends; and wherein each strand of the plurality is of equal length.

* * * * *